United States Patent
Kim et al.

(10) Patent No.: US 9,620,392 B2
(45) Date of Patent: Apr. 11, 2017

(54) SINGLE TYPE APPARATUS FOR DRYING A SUBSTRATE AND SINGLE TYPE SYSTEM FOR CLEANING A SUBSTRATE INCLUDING THE SAME

(71) Applicant: SAMSUNG ELECTRONICS CO., LTD., Suwon-si, Gyeonggi-do (KR)

(72) Inventors: Dong-Soo Kim, Anyang-si (KR); Jae-Phil Boo, Seongnam-si (KR); Kang-Min Paek, Hwseong-si (KR); Keon-Sik Seo, Suwon-si (KR); Jae-Hoon Choi, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 741 days.

(21) Appl. No.: 13/840,942

(22) Filed: Mar. 15, 2013

(65) Prior Publication Data
US 2014/0000661 A1    Jan. 2, 2014

(30) Foreign Application Priority Data
Jul. 2, 2012    (KR) .......................... 10-2012-0071643

(51) Int. Cl.
*H01L 21/67*    (2006.01)
(52) U.S. Cl.
CPC .. *H01L 21/67034* (2013.01); *H01L 21/67028* (2013.01)
(58) Field of Classification Search
CPC .................. H01L 21/67028; H01L 21/67034
USPC .................. 134/94.1, 99.1, 149, 153, 902
See application file for complete search history.

(56) References Cited

U.S. PATENT DOCUMENTS

| | | | |
|---|---|---|---|
| 4,742,624 A | 5/1988 | Grant | |
| 4,750,505 A | 6/1988 | Inuta et al. | |
| 5,829,156 A | 11/1998 | Shibasaki et al. | |
| 5,950,328 A | 9/1999 | Ichiko et al. | |
| 6,516,816 B1 | 2/2003 | Husain et al. | |
| 2003/0031537 A1 | 2/2003 | Tokunaga | |
| 2003/0045098 A1* | 3/2003 | Verhaverbeke ... | H01L 21/67069 438/689 |
| 2003/0079762 A1 | 5/2003 | Husain et al. | |
| 2005/0229427 A1 | 10/2005 | Sugimoto et al. | |
| 2006/0096622 A1 | 5/2006 | Lee et al. | |

(Continued)

FOREIGN PATENT DOCUMENTS

| | | |
|---|---|---|
| JP | 09-257367 | 10/1997 |
| JP | 2004-295048 | 10/2004 |
| JP | 2005-243914 | 9/2005 |

(Continued)

*Primary Examiner* — Michael Barr
*Assistant Examiner* — Levon J Shahinian
(74) *Attorney, Agent, or Firm* — F. Chau & Associates, LLC

(57) ABSTRACT

An apparatus for drying a substrate may include a spin chuck, a drying chamber and a drying fluid line. The spin chuck may be configured to support the substrate. The spin chuck may rotate the substrate. The drying chamber may be configured to receive the spin chuck. The drying chamber may have an inlet, an outlet and a vortex exhaust. A drying fluid may be supplied through the inlet into the drying chamber. The drying fluid may be drained through the outlet. A vortex of the drying fluid may be drained through the vortex exhaust. The drying fluid line may be connected to the inlet.

21 Claims, 2 Drawing Sheets

(56) References Cited

U.S. PATENT DOCUMENTS

2009/0056764 A1* 3/2009 Minami ............ H01L 21/67028
134/27

FOREIGN PATENT DOCUMENTS

| | | |
|---|---|---|
| JP | 2008-159903 | 7/2008 |
| JP | 2009-016687 | 1/2009 |
| KR | 1998-040060 | 8/1998 |
| KR | 1020020006188 | 1/2002 |
| KR | 1020060001021 | 1/2006 |
| KR | 1020060060395 | 6/2006 |

* cited by examiner

SINGLE TYPE APPARATUS FOR DRYING A SUBSTRATE AND SINGLE TYPE SYSTEM FOR CLEANING A SUBSTRATE INCLUDING THE SAME

CROSS-RELATED APPLICATION

This application claims priority to Korean Patent Application No. 10-2012-0071643, filed on Jul. 2, 2012, the disclosure of which is hereby incorporated by reference herein in its entirety.

1. Technical Field

Example embodiments relate to a single type apparatus for drying a substrate and a single type system for cleaning a substrate including the same. More particularly, example embodiments relate to an apparatus for drying semiconductor substrates one by one, and a system for cleaning a semiconductor substrate including the apparatus.

2. Discussion of the Related Art

Generally, during a plurality of fabrication processes performed on a semiconductor substrate to form an integrated circuit, contaminants such as, for example, particles may be attached to the integrated circuit. The contaminants may deteriorate electrical characteristics of the integrated circuit, so that a process for cleaning the semiconductor substrate may need to be performed between the fabrication processes.

The cleaning process may include, for example, a treating process, a rinsing process and a drying process. The treating process may treat the semiconductor substrate using a cleaning solution such as, for example, a chemical solution to remove the contaminants. The rinsing process may rinse the semiconductor substrate treated with the cleaning solution using a rinsing solution such as, for example, deionized water. The drying process may dry the rinsing solution on the semiconductor substrate.

The drying process may use, for example, a spin dryer for drying the semiconductor substrate while the semiconductor substrate is being rotated. The spin dryer may include, for example, a drying chamber having an inlet, an outlet, and a spin chuck installed in the drying chamber. A drying fluid may be supplied through the inlet. The drying fluid may be drained through the outlet. The spin chuck may rotate the semiconductor substrate.

A strong vortex may be generated in the drying chamber due to the rotation of the spin chuck. The vortex may have a flowing direction substantially opposite to a flowing direction of the drying fluid from the inlet to the outlet, so that the vortex may disturb the flow of the drying fluid. Thus, the semiconductor substrate may not be completely dried.

Further, a remaining portion of the rinsing solution and/or particles may be floated in the drying chamber due to the vortex. If the rotation of the spin chuck is suspended, then the rinsing solution and/or the particles may be attached to the semiconductor substrate.

Particularly, as the semiconductor substrate may have a large size, a gap between an inner wall of the drying chamber and the semiconductor substrate may be narrowed. Therefore, as a result, the above-mentioned difficulties may be intensified.

SUMMARY

Example embodiments provide a single type apparatus for drying a substrate that may be capable of preventing a flow of a drying fluid from being influenced by vortex.

Example embodiments also provide a single type system for cleaning a substrate including the above-mentioned apparatus.

According to an example embodiment, there may be provided an apparatus for drying a substrate. The apparatus may include a spin chuck, a drying chamber and a drying fluid line. The spin chuck may be configured to support the substrate. The spin chuck may rotate the substrate. The drying chamber may be configured to receive the spin chuck. The drying chamber may have an inlet, an outlet and a vortex exhaust. A drying fluid may be supplied through the inlet into the drying chamber. The drying fluid may be drained through the outlet. A vortex of the drying fluid may be drained through the vortex exhaust. The drying fluid line may be connected to the inlet.

In an example embodiment, the inlet and the outlet may be disposed at opposite surfaces of the drying chamber substantially perpendicular to a flowing direction of the drying fluid. The inlet may be disposed at an upper surface of the drying chamber. The outlet may be disposed at a lower surface of the drying chamber.

In an example embodiment, the vortex exhaust may be disposed at a surface of the drying chamber substantially parallel to a flowing direction of the drying fluid. The vortex exhaust may be disposed at a side surface of the drying chamber. The vortex exhaust may be downwardly slanted toward a central portion of the spin chuck.

In an example embodiment, the drying fluid line may include an isopropyl alcohol (IPA) line configured to supply IPA to the drying chamber. A collecting unit configured to collect the IPA in the vortex may be connected to the vortex exhaust.

In an example embodiment, the apparatus may further include a guiding member disposed in the drying chamber and configured to concentrate the drying fluid on a central portion of the spin chuck. The guiding member may include a hopper shape and be disposed at an inner surface of the drying chamber. The guiding member may have a lower end positioned relatively closer to the spin chuck than the vortex exhaust to prevent a portion of the drying fluid, which may not reach the substrate, from being drained through the vortex exhaust.

In an example embodiment, the apparatus may further include a fan filter unit configured to remove impurities in the drying fluid.

According to an example embodiment, there may be provided a system for cleaning a substrate. The system may include a spin chuck, a cleaning chamber, a cleaning solution line, a rinsing solution line and a drying fluid line. The spin chuck may be configured to support the substrate. The spin chuck may rotate the substrate. The cleaning chamber may be configured to receive the spin chuck. The cleaning chamber may have an inlet, an outlet and a vortex exhaust. A drying fluid may be supplied through the inlet into the drying chamber. The drying fluid may be drained through the outlet. A vortex of the drying fluid may be drained through the vortex exhaust. The cleaning solution line may be configured to supply a cleaning solution to the cleaning chamber. The rinsing solution line may be configured to supply a rinsing solution to the cleaning chamber. The drying fluid line may be connected to the inlet.

In an example embodiment, the inlet and the outlet may be disposed at opposite surfaces of the cleaning chamber substantially perpendicular to a flowing direction of the drying fluid. The inlet may be disposed at an upper surface of the cleaning chamber. The outlet may be disposed at a lower surface of the cleaning chamber.

In an example embodiment, the system may further include a guiding member disposed in the cleaning chamber and configured to concentrate the drying fluid on a central portion of the spin chuck.

In an example embodiment, the system may further include a fan filter unit configured to remove impurities in the drying fluid.

In accordance with an example embodiment, an apparatus for drying a substrate may be provided. The apparatus includes a drying chamber having an upper surface, a lower surface and a side surface disposed between the upper surface and the lower surface. The drying chamber includes an inlet diposed at the upper surface of the drying chamber through which a drying fluid is introduced into the drying chamber, an outlet disposed at the lower surface of the drying chamber opposite to the inlet and through which the drying fluid is drained from the drying chamber, and a vortex exhaust disposed substantially perpendicular to the side surface of the drying chamber and downwardly slanted toward a central portion of the spin chuck and through which a vortex of the drying fluid is drained.

In addition, the apparatus further includes a spin chuck disposed on the lower surface of the drying chamber, in which the spin chuck is configured to support and rotate the substrate on an upper surface thereof, a drying fluid line connected to the inlet, a drying fluid tank connected to the drying fluid line, a guide disposed at a side of the spin chuck and configured to guide the drying fluid toward the outlet, a fan filter disposed under the upper surface of the drying chamber, in which the fan filter is configured to remove particles in the drying fluid and to move the drying fluid to the substrate disposed on the upper surface of the spin chuck and a guiding member including a first guide slantly extending from the side surface of the drying chamber in a downward direction and a second guide vertically extending from a lower end of the first guide in the downward direction. The second guide has a lower end adjacent to the spin chuck and is disposed under the vortex exhaust.

According to example embodiments, the vortex generated in the drying chamber may be rapidly drained through the vortex exhaust. Thus, the vortex may not disturb the flows of the drying fluid. Further, the rinsing solution and/or particles in the vortex may be drained through the vortex exhaust. Therefore, the rinsing solution and/or the particles may not be attached to the substrate. Furthermore, the guiding member may concentrate the drying fluid on the central portion of the substrate, so that interference between the drying fluid and the vortex may be suppressed. As a result, the apparatus for drying a substrate may have increased drying efficiency.

BRIEF DESCRIPTION OF THE DRAWINGS

Example embodiments can be more clearly understood from the following detailed description taken in conjunction with the accompanying drawings.

FIG. 1 is a cross-sectional view illustrating a single type apparatus for drying a substrate in accordance with an example embodiment;

FIG. 2 is a cross-sectional view illustrating a single type apparatus for drying a substrate in accordance with an example embodiment;

FIG. 3 is a cross-sectional view illustrating a single type system for cleaning a substrate including the apparatus in FIG. 1 in accordance with an example embodiment; and FIG. 4 is a cross-sectional view illustrating a single type system for cleaning a substrate including the apparatus in FIG. 2 in accordance with an example embodiment.

DETAILED DESCRIPTION OF EXAMPLE EMBODIMENTS

Figure 1:
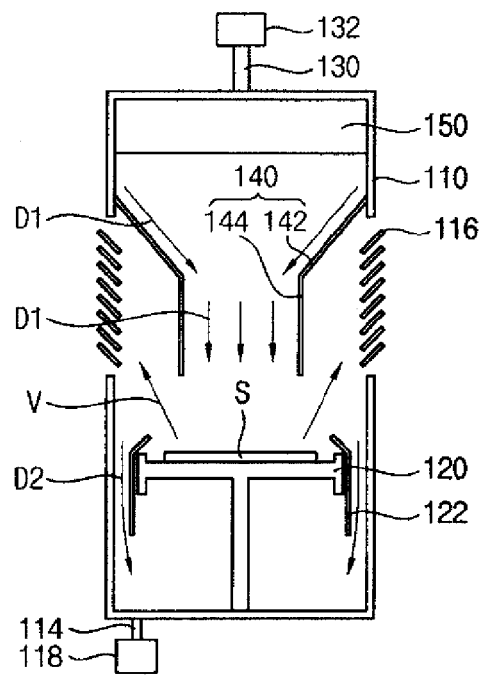
FIGS. 1 to 4 represent non-limiting, example embodiments as described herein.

Various example embodiments will be described more fully hereinafter with reference to the accompanying drawings, in which some example embodiments are shown. Example embodiments of the present invention may, however, be embodied in many different forms and should not be construed as limited to example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout. As used herein, the term "and/or" includes any and all combinations of one or more of the associated listed items.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, example embodiments will be explained in detail with reference to the accompanying drawings.

Single Type Apparatus for Drying a Substrate

FIG. 1 is a cross-sectional view illustrating a single type apparatus for drying a substrate in accordance with an example embodiment.

Referring to FIG. 1, a single type apparatus 100 for drying a substrate in accordance with the present example embodiment may include, for example, a drying chamber 110, a spin chuck 120, a drying fluid line 130, a guiding member 140 and a fan filter unit 150.

In an example embodiment, the drying chamber 110 may have, for example, an upper surface, a lower surface and side surfaces connected between the upper surface and the lower surface. The drying chamber 110 may have, for example, a rectangular parallelepiped shape, a cylindrical shape, etc.

The spin chuck 120 may be arranged on, for example, the lower surface of the drying chamber 110. The substrate S may be placed on an upper surface of the spin chuck 120. Thus, the substrate S may rotate together with rotation of the spin chuck 120. For example, in an example embodiment, the spin chuck 120 may rotate the substrate S one by one.

The drying chamber 110 may have, for example, an inlet 112, an outlet 114 and a vortex exhaust 116. A drying fluid for drying the substrate S may be supplied into the drying chamber 110 through the inlet 112. The drying fluid may be drained from the drying chamber 110 through the outlet 114. A guide 122 may be arranged at, for example, a side of the spin chuck 120. The guide 122 may guide the drying fluid toward the outlet 114. Further, a vacuum pump 118 may be connected to the outlet 114. The vacuum pump 118 may provide vacuum into the drying chamber 110.

The drying fluid line 130 may be connected to the inlet 112. A tank 132 configured to receive the drying fluid may be connected to the drying fluid line 130. In an example embodiment, the drying fluid may include, for example, an inert gas such as a nitrogen gas.

The fan filter unit 150 may be arranged, for example, under the upper surface of the drying chamber 110. The fan filter unit 150 may remove particles in the drying fluid. Further, the fan filter unit 150 may compulsorily move the drying fluid to the substrate S on the spin chuck 120.

To increase drying efficiency, the drying fluid should be provided, for example, in a straight flowing direction substantially perpendicular to the substrate S. Thus, the inlet 112 and the outlet 114 may be arranged, for example, at both sides of the straight flowing direction of the drying fluid. That is, the inlet 112 and the outlet 114 may be formed, for example, at surfaces of the drying chamber 110, respectively, substantially perpendicular to the flowing directions D1 and D2 of the drying fluid. In an example embodiment, the inlet 112 may be formed at the upper surface of the drying chamber 110. In contrast, the outlet 114 may be formed, for example, at the lower surface of the drying chamber 110. Therefore, the inlet 112 and the outlet 114 may be opposite to each other. As a result, the flowing directions D1 and D2 of the drying fluid may correspond to a downward direction from the upper surface to the lower surface of the drying chamber 110.

A vortex may be generated in the drying chamber 110 due to the rotation of the spin chuck 120. A direction V of the vortex may be, for example, different from the flowing directions D1 and D2 of the drying fluid. For example, the direction V of the vortex may be significantly inclined to the flowing directions D1 and D2 of the drying fluid. The direction V of the vortex may be, for example, opposite to the flowing directions D1 and D2 of the drying fluid. That is, the direction V of the vortex may correspond to an upward direction opposite to the flowing directions D1 and D2 of the drying fluid. Therefore, the vortex may disturb the flows of the drying fluid, so that apparatus 100 may have low drying efficiency. For example, most of the drying fluid may not reach to the substrate S due to the vortex. Further, a rinsing solution and/or particles in the vortex may be attached to the substrate S.

In an example embodiment, the vortex exhaust 116 may be provided to the drying chamber 110. The vortex exhaust 116 may be configured to drain the vortex. To effectively drain the vortex flowing toward the upper surface of the drying chamber 110, the vortex exhaust 116 may be formed at, for example, the side surface of the drying chamber 110.

If the vortex exhaust 116 is substantially perpendicular to the side surface of the drying chamber 110, then the vortex may not be effectively drained through the vortex exhaust 116. Thus, in an example embodiment, the vortex exhaust 116 may be, for example, downwardly slanted toward a central portion of the spin chuck 120.

The fan filter unit 150 may uniformly supply the drying fluid to an upper surface of the substrate S. Thus, the vortex may be generated at a central upper space and an edge upper space above the substrate S. The vortex in the edge upper space above the substrate S may be readily drained through the vortex exhaust 116. In contrast, the vortex in the central upper surface above the substrate S may not be readily drained through the vortex exhaust 116. That is, the drying fluid supplied to the edge of the substrate S may hinder the vortex in the central upper space above the substrate S from flowing toward the vortex exhaust 116.

In an example embodiment, the guiding member 140 may be arranged in the drying chamber 110. The guiding member 140 may concentrate the drying fluid compulsorily moved by the fan filter unit 150 on the central portion of the substrate S, i.e., the central portion of the spin chuck 120.

In an example embodiment, the guiding member 140 may include, for example, a first guide 142 and a second guide 144. The first guide 142 may be, for example, slantly extended from the side surface of the drying chamber 110 in the downward direction. The second guide 144 may be, for example, vertically extended from a lower end of the first guide 142 in the downward direction. Thus, the guiding member 140 including the first guide 142 and the second guide 144 may have, for example, a hopper shape. The second guide 144 may have, for example, a lower end adjacent to the spin chuck 120.

Therefore, the drying fluid flowing toward the edge portion of the substrate S may be, for example, guided to the central portion of the substrate S by the first guide 142. The drying fluid may be concentrated on the central portion of the substrate S by the second guide 144. For example, the second guide 144 may serve as a wall for blocking the vortex from moving toward the central portion of the substrate S. Because the drying fluid may be concentrated on the central portion of the substrate S, the vortex may be mainly generated in the edge upper space above the substrate S. In contrast, the vortex may not be generated in the central upper space above the substrate S. Thus, the vortex in the edge upper space above the substrate S may be effectively drained through the vortex exhaust 116 adjacent to the edge portion of the substrate S.

In an example embodiment, the lower end of the guiding member 140, i.e., the lower end of the second guide 144 may be positioned under the vortex exhaust 116. That is, the lower end of the second guide 144 may be positioned, for example, relatively closer to the spin chuck 120 than the vortex exhaust 116. If the lower end of the second guide 144 is positioned above the vortex exhaust 116, then the drying fluid flowing along an inner surface of the second guide 144 may not reach to the substrate S due to the vortex, so that the drying fluid may be drained through the vortex exhaust 116 together with the vortex. To allow the drying fluid to reach the substrate S, the lower end of the second guide 144 may be located under the vortex exhaust 116.

In an example embodiment, the drying fluid may include, for example, the inert nitrogen gas. Thus, the vortex including the inert gas may be discharged from the drying chamber 110 through the vortex exhaust 116. For example, to effectively drain the vortex through the vortex exhaust 116, a vacuum pump (not shown) may be connected to the vortex exhaust 116.

According to the present example embodiment, the vortex generated in the drying chamber 110 may be rapidly drained through the vortex exhaust 116. Thus, the vortex may not disturb the flows of the drying fluid. Further, the rinsing solution and/or particles in the vortex may be drained through the vortex exhaust 116. Therefore, the rinsing solution and/or the particles may not be attached to the substrate S. Furthermore, the guiding member 140 may concentrate the drying fluid on the central portion of the substrate S, so that interference between the drying fluid and the vortex may be suppressed.

Figure 2:
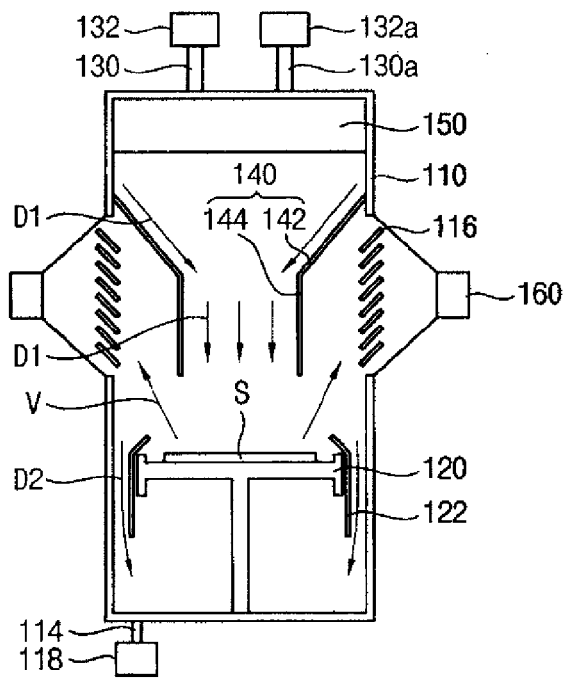

FIG. 2 is a cross-sectional view illustrating a single type apparatus for drying a substrate in accordance with an example embodiment.

A single type apparatus 100a of the present example embodiment may include elements substantially the same as those of the apparatus 100 in FIG. 1 except for further including an IPA line and a collecting unit. Thus, the same reference numerals may refer to the same elements and any further illustrations with respect to the same element may be omitted herein for brevity.

Referring to FIG. 2, the single type apparatus 100a for drying a substrate in accordance with this example embodiment may dry the substrate using, for example, the nitrogen gas and an IPA. That is, the single type apparatus 100a may utilize, for example, a marangoni effect using a low surface tension of the IPA.

Therefore, the single type apparatus 100a of this example embodiment may further include, for example, the IPA line 130a. In addition, for example, an IPA tank 132a may be connected to the IPA line 130a.

For example, in an example embodiment, because the noxious IPA may be used in the apparatus 100a, a collecting unit 160 for collecting the IPA in the vortex may be connected to the vortex exhaust 116. The collecting unit 160 may include, for example, a duct connected to the vortex exhaust 116, and a vacuum pump connected to the duct.

Single Type System for Cleaning a Substrate

Figure 3:
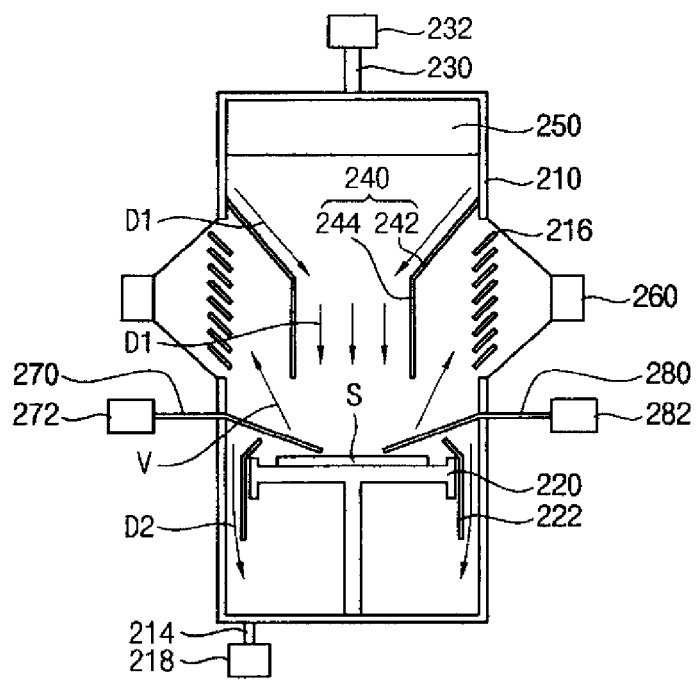

FIG. 3 is a cross-sectional view illustrating a single type system for cleaning a substrate including the apparatus in FIG. 1 in accordance with an example embodiment.

Referring to FIG. 3, a single type system 200 for cleaning a substrate in accordance with the present example embodiment may include, for example, a cleaning chamber 210, a spin chuck 220, a drying fluid line 230, a guiding member 240, a fan filter unit 250, a collecting unit 260, a cleaning solution line 270 and a rinsing solution line 280.

In an example embodiment, the cleaning chamber 210, the spin chuck 220, the drying fluid line 230, the guiding member 240 and the fan filter unit 250 of the system 200 may be substantially the same as the drying chamber 110, the spin chuck 120, the drying fluid line 130, the guiding member 140 and the fan filter unit 150 of the apparatus 100 in FIG. 1. That is, the system 200 may perform a cleaning process, a rinsing process and a drying process using the single cleaning chamber 210. Because noxious chemical solutions may be used in the system 200, the system 200 may further include, for example, the collecting unit 260 substantially the same as the collecting unit 160 in FIG. 2. Therefore, any further illustrations with respect to the cleaning chamber 210, the spin chuck 220, the drying fluid line 230, the guiding member 240, the fan filter unit 250 and the collecting unit 260 may be omitted herein for brevity.

The cleaning solution line 270 may be connected to, for example, a left side surface of the cleaning chamber 210. For example, a cleaning solution tank 272 may be connected to the cleaning solution line 270. The rinsing solution line 280 may be connected to, for example, a right side surface of the cleaning chamber 210. For example, a rinsing solution tank 282 may be connected to the rinsing solution line 280. In an example embodiment, the rinsing solution may include, for example, deionized water.

The spin chuck 220 may rotate the substrate S. The cleaning solution may be supplied to the substrate S through the cleaning solution line 270 to clean the substrate S. After cleaning the substrate 5, the rinsing solution may be supplied to the substrate S with the substrate S being rotated to remove the cleaning solution on the substrate S. The drying process illustrated with reference to FIG. 1 may be performed on the substrate S to dry the substrate S.

Figure 4:
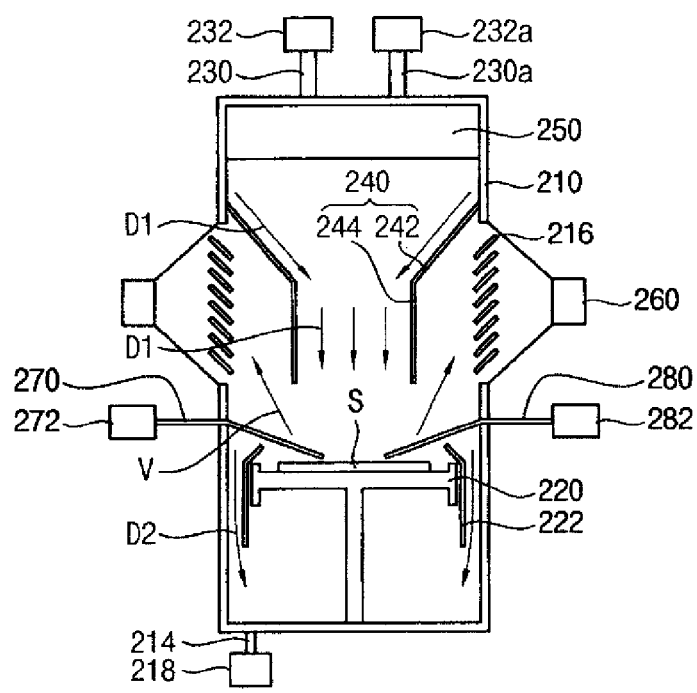

FIG. 4 is a cross-sectional view illustrating a single type system for cleaning a substrate including the apparatus in FIG. 2 in accordance with an example embodiment.

A single type system 200a of the present example embodiment may include elements substantially the same as those of the system 200 in FIG. 3 except for further including an IPA line. Thus, the same reference numerals may refer to the same elements and any further illustrations with respect to the same element may be omitted herein for brevity.

Referring to FIG. 4, the single type system 200a for cleaning a substrate in accordance with the present example embodiment may further include, for example, the IPA line 230a. Thus, the system 200a may dry the substrate using the nitrogen gas and the IPA. Also, for example, an IPA tank 232a may be connected to the IPA line 230a.

That is, the system 200a may perform a drying process substantially the same as that of the apparatus 100a in FIG. 2.

In an example embodiment, the dried and/or cleaned object may include, for example, a semiconductor substrate, a glass substrate, etc. Alternatively, the object may include other electronic substrates as well as the semiconductor substrate and the glass substrate.

According to an example embodiment, the vortex generated in the drying chamber may be rapidly drained through the vortex exhaust. Thus, the vortex may not disturb the flows of the drying fluid. Further, the rinsing solution and/or particles in the vortex may be drained through the vortex exhaust. Therefore, the rinsing solution and/or the particles may not be attached to the substrate. Furthermore, the guiding member may concentrate the drying fluid on the central portion of the substrate, so that interference between the drying fluid and the vortex may be suppressed. As a result, the single type apparatus for drying a substrate may have increased drying efficiency.

Having described example embodiments of the present invention, it is further noted that it is readily apparent to those of ordinary skill in the art that various modifications may be made without departing from the spirit and scope of the invention which is defined by the metes and bounds of the appended claims.

What is claimed is:

1. An apparatus for drying a substrate, the apparatus comprising:
   a spin chuck configured to support the substrate on a top surface thereof and rotate the substrate;
   a drying chamber configured to receive the spin chuck, the drying chamber having an inlet through which a drying fluid is introduced into the drying chamber, an outlet through which the drying fluid is drained from the drying chamber, and a vortex exhaust through which a vortex of the drying fluid is drained; and
   a drying fluid line connected to the inlet,
   wherein the vortex exhaust is disposed above a top surface of the spin chuck and the vortex exhaust comprises a plurality of slits that are angled in a downward direction towards a center of the top surface of the spin chuck such that a vortex of drying fluid, created by the spin chuck, exits the drying chamber through the plurality of slits of the vortex exhaust as the drying fluid is introduced into the drying chamber, and
   wherein the apparatus further comprises a guiding member disposed in the drying chamber, the guiding member configured to physically separate the guiding chamber into a first tunnel within which the drying fluid is directed downwardly from the inlet to the spin chuck, and a second tunnel, surrounding the first tunnel, within which the vortex of drying fluid is directed from the spin chuck to the vortex exhaust.

2. The apparatus of claim 1, wherein the inlet and the outlet are disposed at opposite two surfaces of the drying chamber substantially perpendicular to a flowing direction of the drying fluid.

3. The apparatus of claim 2, wherein the inlet is disposed at an upper surface of the drying chamber, and the outlet is disposed at a lower surface of the drying chamber.

4. The apparatus of claim 1, wherein the vortex exhaust is disposed at a surface of the drying chamber substantially parallel to a flowing direction of the drying fluid.

5. The apparatus of claim 4, wherein the vortex exhaust is disposed at a side surface of the drying chamber.

6. The apparatus of claim 1, wherein the drying fluid line comprises an isopropyl alcohol (IPA) line configured to supply IPA to the drying chamber, and wherein a collecting unit is configured to collect the IPA in the vortex and is connected to the vortex exhaust.

7. The apparatus of claim 1, wherein the guiding member is configured to concentrate the drying fluid on a central portion of the spin chuck.

8. The apparatus of claim 7, wherein the guiding member comprises a hopper shape and is disposed at an inner side surface of the drying chamber.

9. The apparatus of claim 7, wherein the guiding member has a lower end disposed relatively closer to the spin chuck than the vortex exhaust to prevent a portion of the drying fluid, which does not reach the substrate, from being drained through the vortex exhaust.

10. The apparatus of claim 1, further comprising a fan filter unit configured to remove particles in the drying fluid.

11. The apparatus of claim 1, wherein the vortex exhaust is connected to a collecting unit for collecting the drying fluid exiting the drying chamber through the vortex exhaust, and wherein the drying fluid line and the collecting unit are distinct.

12. The apparats of claim 1, wherein the guiding member is a baffle.

13. A system for cleaning a substrate, the system comprising:
a spin chuck configured to support the substrate on a top surface thereof and rotate the substrate;
a cleaning chamber configured to receive the spin chuck, the cleaning chamber having an inlet through which a drying fluid is introduced into the cleaning chamber, an outlet through which the drying fluid is drained from the cleaning chamber, and a vortex exhaust through which a vortex of the drying fluid is drained;
a cleaning solution line configured to supply a cleaning solution to the cleaning chamber;
a rinsing solution line configured to supply a rinsing solution to the cleaning chamber; and
a drying fluid line connected to the inlet,
wherein the vortex exhaust is disposed above the spin chuck and the vortex exhaust comprises a plurality of slits that are angled in a downward direction towards a center of the top surface of the spin chuck such that a vortex of drying fluid, created by the spin chuck, exits the drying chamber through the plurality of slits of the vortex exhaust as the drying fluid is introduced into the cleaning chamber, and
wherein the system further comprises a guiding member disposed in the drying chamber, the guiding member configured to physically separate the guiding chamber into a first tunnel within which the drying fluid is directed downwardly from the inlet to the spin chuck, and a second tunnel, surrounding the first tunnel, within which the vortex of drying fluid is directed from the spin chuck to the vortex exhaust.

14. The system of claim 13, wherein the inlet is disposed at an upper surface of the cleaning chamber, the outlet is disposed at a lower surface of the cleaning chamber, and the vortex exhaust is disposed at a side surface of the cleaning chamber.

15. The system of claim 13, wherein the guiding member is configured to concentrate the drying fluid on a central portion of the spin chuck.

16. The system of claim 13, further comprising a fan filter unit configured to remove particles in the drying fluid.

17. The system of claim 13, further comprising a cleaning solution tank connected to the cleaning solution line and a rinsing solution tank connected to the rinsing solution line and wherein the cleaning solution line and the rinsing solution line are connected to opposite side surfaces of the cleaning chamber than each other.

18. An apparatus for drying a substrate, the apparatus comprising:
a spin chuck configured to support and rotate the substrate on an upper surface thereof;
a drying chamber having an upper surface, a lower surface and a side surface disposed between the upper surface and the lower surface, wherein the drying chamber includes an inlet disposed on the upper surface of the drying chamber through which a drying fluid is introduced into the drying chamber, an outlet disposed at the lower surface of the drying chamber opposite to the inlet and through which the drying fluid is drained from the drying chamber, and a vortex exhaust disposed on the side surface of the drying chamber and downwardly slanted toward a central portion of the spin chuck and through which a vortex of the drying fluid is drained, wherein the spin chuck is disposed on the lower surface of the drying chamber;
a drying fluid line connected to the inlet;
a drying fluid tank connected to the drying fluid line;
a guide disposed at a side of the spin chuck and configured to guide the drying fluid toward the outlet;
a fan filter disposed under the upper surface of the drying chamber, wherein the fan filter is configured to remove particles in the drying fluid and to move the drying fluid to the substrate disposed on the upper surface of the spin chuck; and
a guiding member including a first guide dandy extending from the side surface of the drying chamber in a downward direction and a second guide vertically extending from a lower end of the first guide in the downward direction, wherein the second guide has a lower end adjacent to the spin chuck and disposed under the vortex exhaust,
wherein the vortex exhaust is disposed above the upper surface of the spin chuck and the vortex exhaust comprises a plurality of slits that are angled in a downward direction towards a center of the upper surface of the spin chuck such that a vortex of drying fluid, created by the spin chuck, exits the drying chamber thorough the plurality of slits of the vortex exhaust as the drying fluid is introduced into the drying chamber, and
wherein the apparatus further comprises a guiding member disposed in the drying chamber, the guiding member configured to physically separate the guiding chamber into a first tunnel within which the drying fluid is directed downwardly from the inlet to the spin chuck, and a second tunnel, surrounding the first tunnel, within which the vortex of drying fluid is directed from the spin chuck to the vortex exhaust.

19. The apparatus of claim 18, further comprising a vacuum pump connected to the outlet, wherein the vacuum pump is configured to provide a vacuum into the drying chamber.

20. The apparatus of claim 18, further comprising an isopropyl alcohol (IPA) line configured to supply IPA to the drying chamber, an IPA tank connected to the IPA line and a collecting unit connected to the vortex exhaust and configured to collect the IPA in the vortex.

21. The apparatus of claim 20, wherein the drying fluid supplied by the drying fluid line includes nitrogen gas.

\* \* \* \* \*